(12) United States Patent
Choo

(10) Patent No.: US 6,515,452 B2
(45) Date of Patent: Feb. 4, 2003

(54) REMAINING BATTERY CAPACITY CORRECTOR AND CONTROLLING METHOD THEREFOR

(75) Inventor: Yeon-Chul Choo, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/987,949

(22) Filed: Nov. 16, 2001

(65) Prior Publication Data

US 2002/0093312 A1 Jul. 18, 2002

(30) Foreign Application Priority Data

Nov. 27, 2000 (KR) ........................................ 2000-70994

(51) Int. Cl.$^7$ ........................ H01M 10/44; H01M 10/46
(52) U.S. Cl. ........................................ 320/132; 320/149
(58) Field of Search ................................ 320/128, 135, 320/132, 149, 150, 162, 164; 324/426, 431, 433

(56) References Cited

U.S. PATENT DOCUMENTS

| | | | |
|---|---|---|---|
| 5,561,362 A | * | 10/1996 | Kawamura et al. |
| 5,606,242 A | | 2/1997 | Hull et al. |
| 5,652,502 A | | 7/1997 | van Phuoc et al. |
| 5,710,501 A | | 1/1998 | van Phuoc et al. |
| 5,796,239 A | * | 8/1998 | Van Phuoc et al. |
| 5,955,869 A | | 9/1999 | Rathmann ................ 320/132 |
| 6,163,131 A | | 12/2000 | Gartstein et al. ......... 320/118 |
| 6,300,763 B1 | * | 10/2001 | Kwok |

* cited by examiner

*Primary Examiner*—Edward H. Tso
(74) *Attorney, Agent, or Firm*—Robert E. Bushnell, Esq.

(57) ABSTRACT

A remaining battery capacity corrector and a controlling method therefor are provided. The remaining battery capacity corrector corrects errors in a calculated remainingbattery capacity and includes a voltage detector for detecting an output voltage of a battery, a current detector for detecting an output current of the battery, a temperature detector for detecting a temperature of the battery, a remaining battery capacity correction table storage unit for storing a remaining battery capacity correction table representing a reference output voltage, so as to correspond to the output current and the temperature of the battery, and a controller for correcting the displayed value of the remaining battery capacity based on the reference output voltage in the remaining battery capacity correction table, in the case that the output voltage is less than the reference output voltage in the remaining battery capacity correction table which is dependent on the detected output current and the battery temperature. With this configuration, an error of the displayed value of the remaining battery capacity can be corrected precisely.

27 Claims, 3 Drawing Sheets

REMAINING BATTERY CAPACITY CORRECTOR AND CONTROLLING METHOD THEREFOR

CLAIM OF PRIORITY

This application makes reference to, incorporates the same herein, and claims all benefits accruing under 35 U.S.C. §119 from my application entitled REMAINING BATTERY CAPACITY COMPENSATOR AND METHOD OF CONTROLLING THE SAME filed with the Korean Industrial Property Office on Nov. 27, 2000 and there duly assigned Ser. No. 2000/70994.

BACKGROUND OF THE INVENTION

1. Field of the Invention

The present invention relates to a remaining battery capacity corrector and a controlling method therefor, and more particularly, to an apparatus and a method for accurately correcting an error which is generated in calculating a remaining capacity of a battery using an output voltage, a current and a temperature of the battery.

2. Description of the Related Art

In general, a battery used in a portable electronic device such as a portable computer and a wireless telephone, includes a display for displaying the remaining battery capacity, thereby letting a user know when a battery re-charging is needed. This battery is called a 'smart battery.' The smart battery includes an internal micro-controller, which provides information such as a battery status and a remaining battery capacity to an external device.

The micro-controller determines a new reference total capacity according to a varying battery capacity. In order to display the remaining battery capacity, the micro-controller displays the remaining battery capacity in percentage with respect to the reference total capacity. Here, the a reference total capacity is determined as a discharged capacity from the full charged state to the state that a battery voltage is lowered down to a predetermined voltage level by a discharging operation.

However, a user often re-charges the battery before the voltage of the battery reaches the predetermined voltage level. Accordingly, since a point in time when the user stops discharging the battery is varied, an error occurs in setting the reference total capacity. As a result, a displayed remaining battery capacity is not reliable.

SUMMARY OF THE INVENTION

Accordingly, the present invention has been made keeping in mind the above-described problem, and an object of the present invention is to provide an apparatus and a method for calculating a remaining battery capacity accurately irrespective of a re-charging point of time.

It is also an object of the present invention to provide a smart battery that precisely determines the remaining capacity of a battery when the battery is almost fully discharged, allowing a user to recharge the battery neither too early or too late.

It is further an object of the present invention to consult look-up tables during the discharge of a smart battery to determine the precise point of recharge by comparing the output voltage of the battery with a threshold voltage of a battery based on the battery's temperature and output current.

These and other objects of the present invention may be accomplished by a provision of a remaining battery capacity corrector for correcting an error in a calculated remaining battery capacity, the remaining battery capacity corrector having a voltage detector for detecting an output voltage of a battery, a current detector for detecting an output current of the battery, a temperature detector for detecting a temperature of the battery, a remaining battery capacity correction table storage unit for storing remaining battery capacity correction tables representing a reference output to voltage, so as to correspond to the output current and the temperature of the battery; and a controller for correcting the remaining battery capacity based on the reference output voltage in the remaining battery capacity correction table, in the case that the detected output voltage is less than the reference output voltage in the remaining battery capacity correction table, the reference voltage in the correction table being based on the detected output current and temperature.

It is preferable that the remaining battery capacity correction tables represent the reference output voltage depending upon the output current and the temperature of the battery, at a point of time when the remaining battery capacity lacks from a predetermined reference and at a point of time just before the remaining battery capacity is exhausted.

According to another aspect of the present invention, this and other objects may also be accomplished by a provision of a remaining battery capacity correction method having the steps of (a) establishing a reference output voltage of a battery so as to correspond to an output current and a temperature of the battery; (b) detecting the output voltage, the output current, and the temperature of the battery; (c) comparing the detected output voltage with the reference output voltage based on the detected output current and detected temperature of the battery; and (d) correcting the remaining battery capacity based on the reference output voltage. Steps (b) and (c) are repeated by a predetermined number, prior to step (d), and steps (b) through (d) are repeated. The reference output voltage is established so as to represent a point of time when the remaining battery capacity can be calibrated to predetermined reference, a point of time just before the remaining battery capacity is exhausted.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
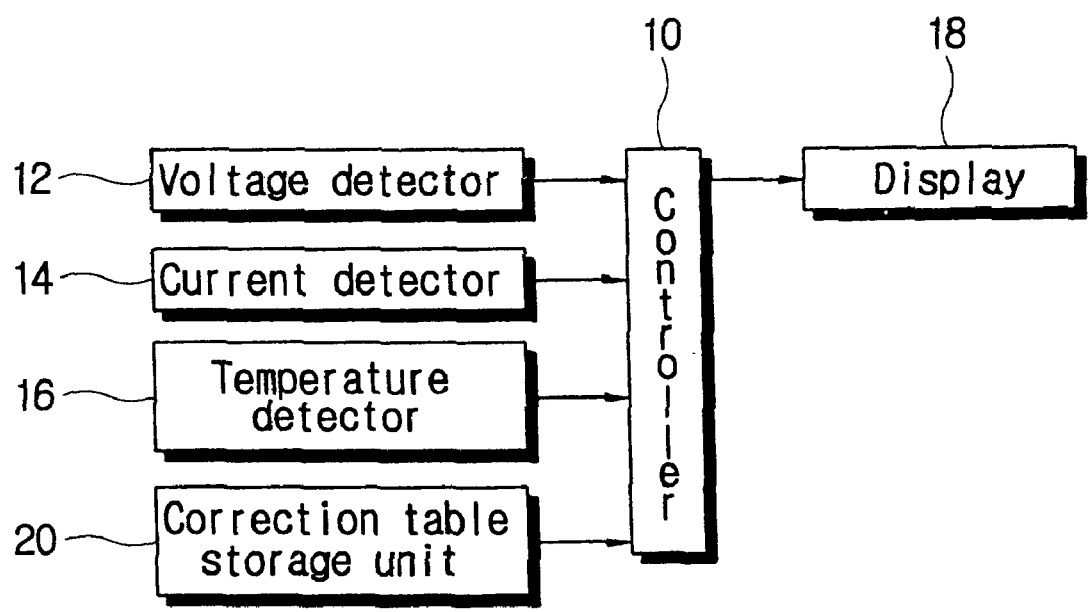
FIG. 1 is a block diagram showing a remaining battery capacity corrector according to the present invention.

As shown in FIG. 1, a remaining battery capacity corrector according to the present invention includes a display 18 for displaying the remaining battery capacity, a voltage detector 12 for detecting an output voltage of a battery, a current detector 14 for detecting an output current of the battery, and a temperature detector 16 for detecting a temperature of the battery. The remaining battery capacity corrector includes a controller 10 for calculating the remaining battery capacity and correcting an error, according to the values detected by the detectors 12, 14 and 16. To the controller 10 is connected a remaining battery capacity correction table storage unit 20 storing a remaining battery capacity correction tables representing the relation between the number of charging and discharging the battery and the output voltage, the output current, and the temperature of the battery.

The controller 10 calculates the remaining battery capacity, similar to earlier current accumulation methods, by adding the current detected in the current detector 14 to the previous remaining battery capacity, if a charging operation starts, and by subtracting the detected current from the previous battery capacity, if a discharging operation starts. That is, the calculation is performed by the following equations (1) and (2).

During the charging of a battery:

$$\text{remaining battery capacity } (n) = \text{remaining battery capacity } (n-1) + (\text{current} * \text{time} * \text{correction factor}) \quad (1)$$

During the discharging of a battery:

$$\text{remaining battery capacity } (n) = \text{remaining battery capacity } (n-1) - (\text{current} * \text{time} * \text{correction factor}) \quad (2)$$

At the time of discharging, the controller 10 displays the remaining battery capacity calculated using the equation (2) on the display 18. Also, the voltage detector 12, the current detector 14 and the temperature detector 16 detect the output voltage, the output current, and the temperature of the battery at the same time when the discharging operation starts, and transmit the detected values to the controller, respectively. The controller 10 compares the detected values of the output voltage, the output current, and the temperature of the battery with those of the remaining battery capacity correction table.

It is preferable that the remaining battery capacity correction table during battery discharge calibrates the remaining battery capacity at a time when the remaining battery capacity is low and when the battery needs to be recharged soon. This point could either be a remaining battery capacity shortage warning state (referred to as "a low battery point") or a remaining battery capacity danger warning state (referred to as "a low low battery point"). This is significant because the correction of the remaining battery capacity becomes more important when the remaining battery capacity approaches exhaustion.

The low battery point is chiefly determined based on the battery output voltage by means of the controller 10. The battery output voltage at the low battery point is varied according to the number of times the battery has been through a charging and discharging cycle, the output current and the battery temperature. A remaining battery capacity correction table at the low battery point is made up of values measured by simulating change in the output voltage of the battery according to the number of times the battery has been charged and discharged, the output current, and the temperature of the battery at low battery point, as illustrated in the following Table 1, where "C" is a unit of current. For example, if "C" is 2 amperes, 0.5C is 1 ampere. The following Table 1 represents a preferred example at the time when BP (remaining battery capacity percentage) is 11%.

TABLE 1

Remaining battery capacity correction table at the low battery point (1–50 cycles)

|        | 0.25 C  | 0.50 C  | 0.75 C  | 1.00 C  | 1.25 C  |
|--------|---------|---------|---------|---------|---------|
| 15° C. | 3.440 V | 3.460 V | 3.480 V | 3.500 V | 3.510 V |
| 30° C. | 3.450 V | 3.470 V | 3.490 V | 3.510 V | 3.520 V |
| 45° C. | 3.460 V | 3.480 V | 3.500 V | 3.520 V | 3.530 V |
| 50° C. | 3.470 V | 3.490 V | 3.510 V | 3.530 V | 3.540 V |

Similarly, the low low battery point is determined based on the battery output voltage. The battery output voltage at the low low battery point is varied according to the number of times the battery has been charged and discharged, the output current and the battery temperature. A remaining battery capacity correction table at the low low battery point is made up of values measured by simulating change in the output voltage of the battery according to the life cycle of the battery, the output current, and the temperature of the battery at the low low battery point, as illustrated in the following Table 2. The following Table 2 represents a preferred example at the time when BP is 4%.

TABLE 2

Remaining battery capacity correction table at the low low battery point (1–50 cycles).

|        | 0.25 C  | 0.50 C  | 0.75 C  | 1.00 C  | 1.25 C  |
|--------|---------|---------|---------|---------|---------|
| 15° C. | 3.140 V | 3.160 V | 3.180 V | 3.200 V | 3.210 V |
| 30° C. | 3.150 V | 3.170 V | 3.190 V | 3.210 V | 3.220 V |
| 45° C. | 3.160 V | 3.180 V | 3.200 V | 3.220 V | 3.230 V |
| 50° C. | 3.170 V | 3.190 V | 3.210 V | 3.230 V | 3.240 V |

As illustrated in the Tables, the remaining battery capacity correction tables are obtained by the values measured by simulating change in the output voltage of the battery according to the number of times the battery has been charged and discharged, the output current, and the temperature of the battery at the low battery point and at the low low battery point.

In general, the low battery point is set as the state when the remaining battery capacity is 9–11% of the total battery capacity, and the low low battery point is set as the state when the remaining battery capacity is 2–4% of the total battery capacity. The remaining battery capacity correction at the low battery point and the low low battery point is performed whenever the battery capacity starts a discharging operation.

Figure 2:
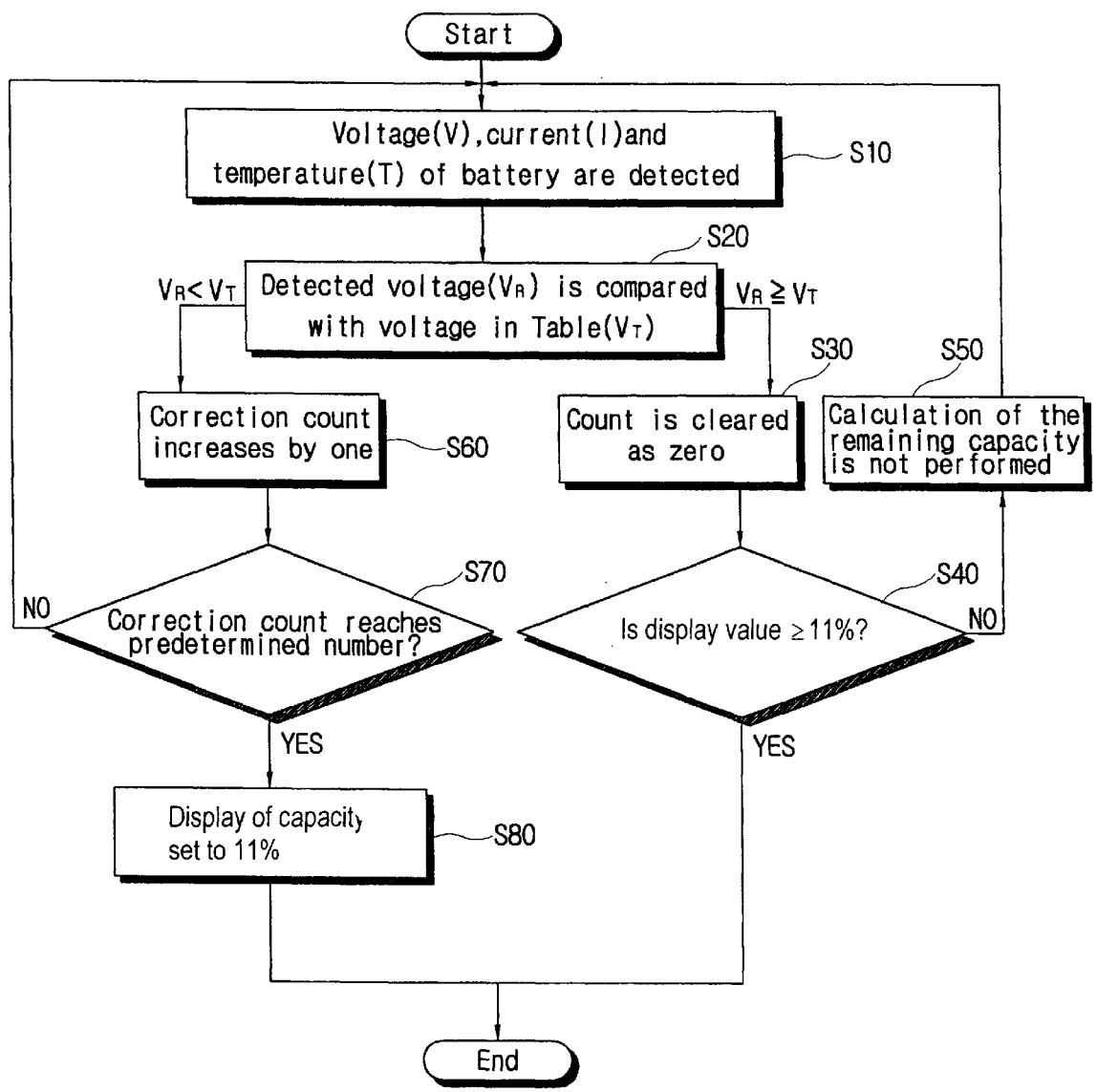
FIG. 2 is a flow chart for explaining a remaining battery capacity correcting method according to the present invention.

FIG. 2 illustrates a correction sequence of a remaining battery capacity correcting apparatus according to the present invention. In FIG. 2, the correction sequence is for the case where the remaining battery capacity is 11% of the total battery capacity, that is, at the low battery point. In this case, the remaining battery capacity correction table to be used is illustrated in Table 1.

The voltage detector 12, the current detector 14 and the temperature detector 16 transfer the detected values to the controller 10 periodically after the battery starts a discharging operation (S10). The controller 10 compares the detected values of the output voltage, the output current, and the temperature of the battery with those of the remaining battery capacity correction Table 1 in the case of BP 11% (S20). Here, an output voltage ($V_T$) in Table 1 corresponding to the detected values of the output current and the battery temperature is compared with the detected output voltage ($V_R$). When $V_R \geq V_T$, the correction count is set to zero (S30). Here, the correction count represents the number of consecutive times $V_R<V_T$. Then, it is confirmed whether the displayed value of the remaining battery capacity is not less than BP 11% (S40). Here, if the displayed value of the remaining battery capacity is not less than BP 11%, it means that the displayed battery capacity is calculated correctly. Accordingly, the displayed value of the remaining battery capacity is calculated using the equation (2) without correction. If the displayed value of the remaining battery capacity is less than BP 11%, it indicates that the displayed remaining battery capacity value is lower than the actual remaining battery capacity. Accordingly, calculation of the displayed remaining battery capacity is not performed so that the present display of BP=11% can be maintained (S50). Even under the condition that the remaining battery capacity for display is not calculated, the output voltage, the output current and the temperature of the battery should be continuously detected. If the remaining battery capacity for display is not calculated, the displayed remaining capacity remains unchanged; however, since the battery actually continues to be discharged, it is needed to perform the correction when the actual remaining capacity of the battery reaches the low battery point.

Meanwhile, when $V_R<V_T$ in the result of comparison at the step S20, the correction count increases by one (S60). Then, it is confirmed whether the correction count reaches a predetermined count (S70). If the correction count is not less than the predetermined count, this indicates that the output voltage $V_R$ has been measured as having a low value continuously, so that it is possible to conclude that the remaining battery capacity has reached the low battery point. Then, the displayed remaining battery capacity is corrected to read BP=11% by means of the controller 10 (S80).

After having performed the remaining battery capacity correction for BP=11%, the controller 10 compares the detected values of the output voltage, the output current, and the temperature of the battery with those of Table 1. Where the detected output voltage is less than a voltage of the BP 11%, it indicates that the calculation of the remaining capacity is performed properly, and therefore, the remaining capacity of the battery is calculated as same as in the previous process, i.e. using equation (2). Where the detected values are higher than a voltage of BP=11%, it indicates that the displayed remaining capacity is low in comparison with the actual remaining capacity, and therefore, the calculation for the remaining capacity is not performed so as to allow the displayed remaining capacity to remain unchanged.

Figure 3:
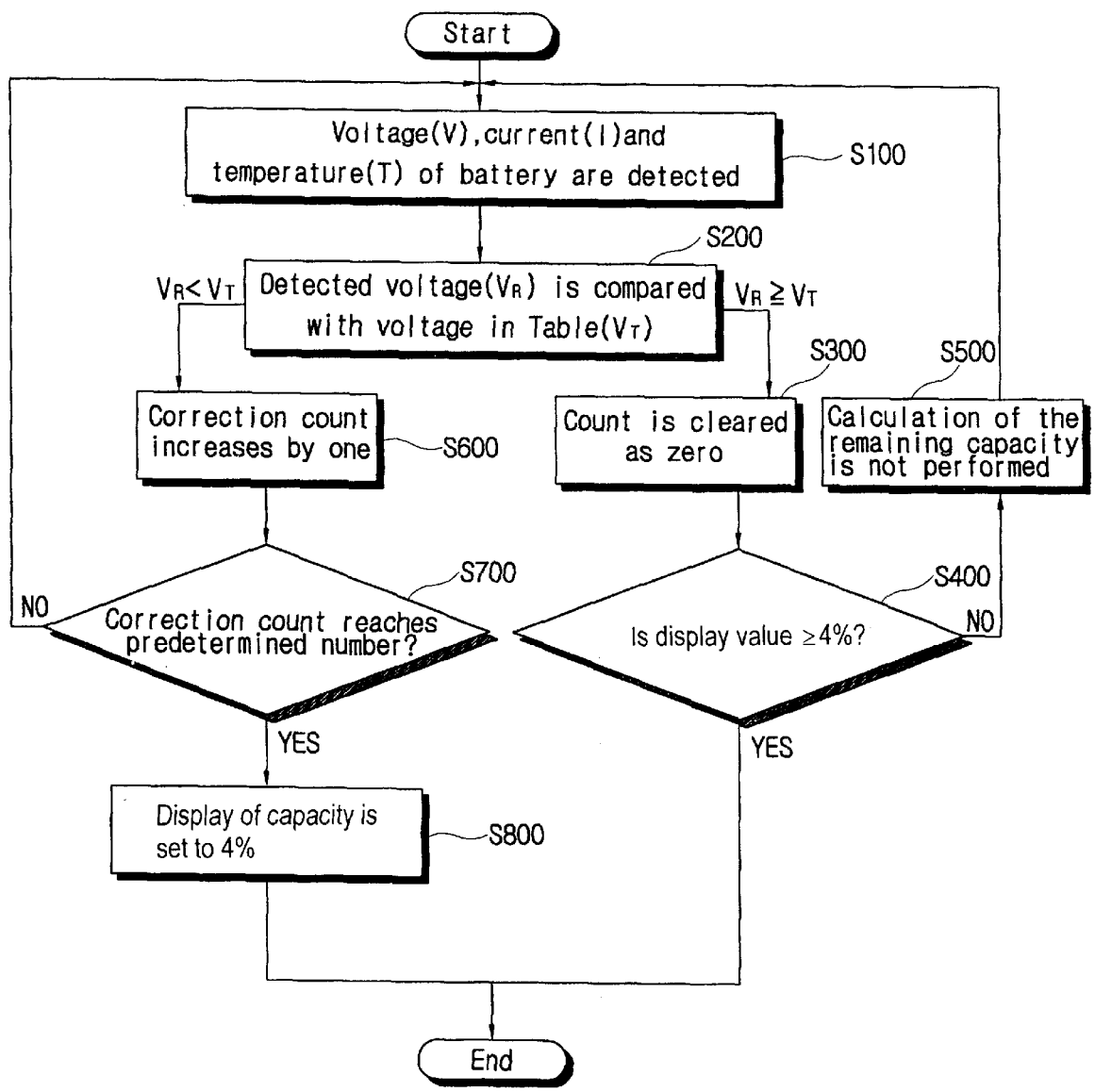
FIG. 3 is a flow chart for explaining a remaining battery capacity correcting method according to another embodiment of the present invention.

FIG. 3 illustrates a remaining battery capacity correcting method at the low low battery point with respect to the case that the low low battery point is set to 4% of the total capacity of the battery and the battery is being discharged. In this case, the remaining battery capacity correction table utilizes Table 2. The voltage detector 12, the current detector 14 and the temperature detector 16 detect the output voltage, the output current and the temperature of the battery and transfer the detected values to the controller 10 periodically (S100). The controller 10 compares the detected values of the output voltage, the output current, and the temperature of the battery with those of Table 2 (S200). Here, the detected output voltage ($V_R$) in Table 2 is compared with a threshold output voltage ($V_T$) corresponding to the detected output current and detected temperature.

When $V_R \geq V_T$ in the result of comparison, the correction count is set to zero (S300). Then, it is confirmed whether the displayed value of the remaining battery capacity is not less than BP 4% (S400). Here, in the case that the displayed value of the remaining battery value is not less than BP 4%, it means that the displayed remaining battery capacity has been calculated correctly. Accordingly, the displayed remaining battery capacity is calculated using the equation (2). However, in the case that the displayed value of the remaining battery capacity value is less than BP 4%, it indicates that the displayed value of the remaining battery capacity value is lower than the actual remaining battery capacity. Accordingly, calculation of the remaining battery capacity is not performed so that the currently displayed BP=4% can be maintained (S500) while the battery continues to discharge.

Meanwhile, when $V_R<V_T$ in the result of comparison at the Step S200, the correction count increases by one (S600). Then, it is confirmed whether the correction count reaches a predetermined count (S700). When the correction count is not less than the predetermined count, the displayed value of the remaining battery capacity is corrected to read BP=4% by means of the controller 10 (S800). After correction, the output voltage, the output current and the temperature of battery are detected.

By the above constitution, since the displayed value of the remaining battery capacity is corrected using the output voltage, the output current, and the temperature of the battery, the user can correct an error in the displayed value of the remaining battery capacity calculation irrespective of a re-charging point of time. As described above, the present invention provides a remaining battery capacity corrector and controlling method therefor which can correct an error occurring at the time of calculating the remaining battery capacity for display precisely.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A remaining battery capacity corrector correcting an error in a calculated remaining battery capacity at a point near total exhaustion of said remaining battery capacity, the remaining battery capacity corrector comprising:

a display displaying remaining battery capacity of said battery;

a voltage detector detecting an output voltage of the battery;

a current detector detecting an output current of the battery;

a temperature detector detecting a temperature of the battery;

a remaining battery capacity correction table storage unit storing a remaining battery capacity correction table representing a reference output voltage that is dependent on the output current and the temperature of the battery only at a predetermined point when said remaining battery capacity is near exhaustion; and a controller correcting a remaining battery capacity displayed on said display, said correction being based on the reference output voltage of the remaining battery capacity correction table, in the case that the detected output voltage of the battery is less than the reference output voltage in the remaining battery capacity correction table.

2. The remaining battery capacity corrector of claim 1, wherein said remaining battery capacity correction table represents the reference output voltage depending upon the output current and the temperature of the battery, at a point of time when the actual remaining battery capacity is almost exhausted.

3. The remaining battery capacity corrector of claim 1, wherein said reference output voltages listed in said remaining battery capacity correction table are also dependent on the number of times said battery has been discharged and recharged.

4. A remaining battery capacity correction method, comprising the steps of:
  (a) establishing a reference output voltage of a battery so as to correspond to an output current and a temperature of the battery at a point of time just before a remaining battery capacity is exhausted;
  (b) detecting the output voltage, the output current, and the temperature of the battery;
  (c) comparing the detected output voltage with the reference output voltage that is dependent upon the detected output current and temperature of the battery; and
  (d) correcting the remaining battery capacity based on the reference output voltage, in the case that the detected output voltage is less than the reference output voltage.

5. The remaining battery capacity correction method of claim 4, wherein the steps (b) and (c) are repeated by a predetermined number, prior to the step (d).

6. The remaining battery capacity correction method of claim 5, wherein the steps (b) through (d) are repeated.

7. The remaining battery capacity correction method of claim 5, wherein the reference output voltage is established so as to represent a point of time just before the remaining battery capacity is exhausted.

8. The method of claim 5, wherein said reference voltage values are further dependent upon a number of times said battery has been discharged and recharged.

9. The remaining battery capacity correction method of claim 5, wherein the reference output voltage is established so as to represent a point of time substantially before the remaining battery capacity is exhausted.

10. A precise method for alerting a user when a discharging battery needs to be recharged, said method comprising the steps of:
  recalculating a remaining battery capacity for display, said calculation based on current output by said battery and duration of time that has elapsed from a previous calculation;
  detecting an output voltage, an output current, and a battery temperature of said battery;
  comparing said output voltage with a threshold voltage, said threshold voltage being stored in a look-up table and being dependent upon said output current and said battery temperature;
  comparing said remaining battery capacity for display with a threshold battery capacity;
  returning to said recalculating step when said output voltage is not less than said threshold voltage and said displayed battery capacity is not less than said threshold capacity;
  returning to said detecting step when said output voltage is not less than said threshold voltage and said displayed battery capacity is less than said threshold battery capacity; and
  setting said remaining capacity for display equal to said threshold capacity when said output voltage is less than said threshold voltage.

11. The method of claim 10, further comprising the steps of:
  incrementing a counter;
  determining whether said counter reaches a threshold value; and
  returning to said detecting step if said counter is less than said threshold value, whenever said output voltage of said battery is less than said threshold voltage.

12. The method of claim 11, further comprising the step of setting said counter to zero whenever said step of comparing said remaining battery capacity for display with a threshold battery capacity is executed.

13. The method of claim 10, wherein said threshold voltage is further dependent on said threshold capacity.

14. The method of claim 10, wherein said threshold voltage is further dependent on a number of times said battery has been discharged and recharged.

15. The method of claim 10, wherein said display displays to said user a remaining battery capacity in terms of percentage of a total capacity of said battery remaining available for discharge before said battery is exhausted.

16. The apparatus of claim 1, a predetermined point near exhaustion being when said remaining battery capacity falls to said predetermined point where the remaining battery capacity is in the range of 2%–12% of a total capacity of said battery.

17. The method of claim 4, said point of time just before a remaining battery capacity is exhausted being at a point when said remaining battery capacity is in the range of 2% to 4% of the total battery capacity.

18. The method of claim 4, said correcting the remaining battery capacity being defined as correcting a remaining battery capacity displayed on a display of said battery.

19. A method for correcting a displayed remaining battery capacity of a battery during discharging only when said remaining battery capacity is near exhaustion, said method comprising the steps of:
  recalculating a remaining battery capacity for said display, said calculation based on current output by said battery and duration of time that has elapsed from a previous calculation;
  detecting an output voltage, an output current, and a battery temperature of said battery;
  comparing said output voltage with a threshold voltage, said threshold voltage being stored in a look-up table and being dependent upon said output current and said battery temperature;
  comparing said remaining battery capacity displayed on said display with a threshold battery capacity; and
  when said output voltage is greater than said threshold voltage and when said remaining battery capacity on said display is less than said threshold battery capacity, repeating said detecting and said comparing said output voltage steps while keeping a remaining battery capacity displayed on said display unchanged until said output voltage becomes smaller than said threshold voltage.

20. The method of claim 19, said method further comprising the step of performing a one time only correction to a value displayed on said display when said detected output voltage falls below said threshold voltage.

21. The method of claim 20, said one time only correction being when said remaining battery capacity is at a predetermined point between 2% and 4% of total capacity of said battery.

22. The method of claim 19, said threshold voltage being further dependent on a number of times said battery has been charged and discharged.

23. A method for performing a one time only correction to a display on a discharging battery that displays a remaining battery capacity, said one time correction being made at a predetermined point when said remaining battery capacity is nearly exhausted, said method comprising the steps of:

recalculating a remaining battery capacity for display, said calculation based on current output by said battery and duration of time that has elapsed from a previous calculation;

detecting an output voltage, an output current, and a battery temperature of said battery;

comparing said output voltage with a threshold voltage, said threshold voltage being stored in a look-up table and being dependent upon said output current and said battery temperature; and performing said one time only adjustment to said display when said detected output voltage of said battery is less than said threshold voltage.

24. The method of claim 23, said method being followed by the step of recalculating a remaining battery capacity for display, said calculation being based on a current output of said battery and a duration of time that has elapsed since said one time adjustment.

25. The method of claim 24, said method being followed by the step of recalculating a remaining battery capacity for display, said calculation being based on a current output of said battery and a duration of time that has elapsed from said previous calculation.

26. The method of claim 23, said threshold voltage stored in said look-up table being a voltage that is output by said battery when a remaining battery capacity is at said predetermined point where said remaining battery capacity is between 2% and 4% of a total capacity of said battery.

27. The method of claim 23, said threshold voltage being further based on a number of times said battery has been through a charge and discharge cycle.

* * * * *